United States Patent
Duqi et al.

(10) Patent No.: US 12,134,556 B2
(45) Date of Patent: Nov. 5, 2024

(54) SEMICONDUCTOR DEVICE AND METHOD FOR MANUFACTURING A SEMICONDUCTOR DEVICE

(71) Applicants: STMICROELECTRONICS S.R.L., Agrate Brianza (IT); STMicroelectronics International N.V., Geneva (CH)

(72) Inventors: Enri Duqi, Milan (IT); Lorenzo Baldo, Bareggio (IT); Paolo Ferrari, Gallarate (IT); Benedetto Vigna, Geneva (CH); Flavio Francesco Villa, Milan (IT); Laura Maria Castoldi, Abbiategrasso (IT); Ilaria Gelmi, Verano Brianza (IT)

(73) Assignees: STMICROELECTRONICS S.R.L., Agrate Brianza (IT); STMicroelectronics International N.V., Geneva (CH)

( * ) Notice: Subject to any disclaimer, the term of this patent is extended or adjusted under 35 U.S.C. 154(b) by 323 days.

(21) Appl. No.: 17/534,286

(22) Filed: Nov. 23, 2021

(65) Prior Publication Data
US 2022/0169498 A1 Jun. 2, 2022

(30) Foreign Application Priority Data
Nov. 30, 2020 (IT) .................. 102020000029078

(51) Int. Cl.
*B81B 7/00* (2006.01)
(52) U.S. Cl.
CPC .................. *B81B 7/0035* (2013.01)
(58) Field of Classification Search
None
See application file for complete search history.

(56) References Cited

U.S. PATENT DOCUMENTS

| | | |
|---|---|---|
| 5,919,364 A | 7/1999 | Lebouitz et al. |
| 7,075,160 B2 | 7/2006 | Partridge et al. |
| 8,536,663 B1 | 9/2013 | Kuo et al. |
| 2011/0031567 A1* | 2/2011 | Corona ............... B81C 1/00047 257/419 |
| 2012/0153408 A1* | 6/2012 | in 't Zandt ......... B81C 1/00333 438/51 |
| 2018/0070162 A1 | 3/2018 | Lim et al. |
| 2018/0103324 A1 | 4/2018 | Yoo |
| 2019/0375629 A1* | 12/2019 | Duqi ................... B81C 1/00523 |

* cited by examiner

*Primary Examiner* — Benjamin P Sandvik
(74) *Attorney, Agent, or Firm* — Seed IP Law Group LLP

(57) ABSTRACT

A semiconductor device includes: a substrate; a transduction microstructure integrated in the substrate; a cap joined to the substrate and having a first face adjacent to the substrate and a second, outer, face; and a channel extending through the cap from the second face to the first face and communicating with the transduction microstructure. A protective membrane made of porous polycrystalline silicon permeable to aeriform substances is set across the channel.

19 Claims, 7 Drawing Sheets

SEMICONDUCTOR DEVICE AND METHOD FOR MANUFACTURING A SEMICONDUCTOR DEVICE

BACKGROUND

Technical Field

The present disclosure relates to a semiconductor device and to a method for manufacturing a semiconductor device.

Description of the Related Art

As is known, electronic, microelectromechanical and microfluidic devices must be protected against external agents, such as dust, moisture and aggressive substances, which may cause damage and malfunctioning. In many cases, the devices may be sealed within packages that isolate them completely from the external environment from the mechanical and fluidic standpoint, while enabling electrical or electromagnetic coupling. However, devices exist, in particular some transducers, that by their very nature require a connection not only electrical with the outside world and consequently cannot benefit from sealed packages. For instance, electro-acoustic transducers (microphones and speakers), pressure sensors and sensors for detecting gases or volatile substances must be fluidically coupled to the environment for receiving and transmitting static pressures or pressure variations, according to the type of device and the operating principle. The packages for these devices are therefore provided with openings, which if, on the one hand, guarantee proper operation, on the other, reduce protection against penetration of potentially harmful external agents. Other examples of devices that cannot be sealed are some types of actuators and many microfluidic circuits and devices, such as micropumps and microfluidic valves.

Known solutions envisage either closing the openings by applying layers of transpirant polymeric fabric (for example, expanded polytetrafluoroethylene, ePTFE) or providing openings in the form of channels or vents having a very small cross-section so as to prevent entry of particulate and dust above a given diameter. However, both solutions have limitations. In the first case, applying layers of fabric entails considerable costs, because the operation can be carried out only by pick and place on the individual device and not during machining at the wafer level. The channels or vents may be provided during manufacture at the wafer level, but, given that to provide an adequate mechanical protection the packages normally have a considerable thickness, it may be difficult to reduce the diameter of the channels until the desired protection is guaranteed. Consequently, fine particulate could reach the device to be protected.

BRIEF SUMMARY

The present disclosure is directed to provide a semiconductor device and a method for manufacturing a semiconductor device that will enable the limitations described to be overcome or at least attenuated.

The present disclosure is directed to a device that includes a transduction microstructure in a substrate. There is a cap coupled to the substrate and having a first face facing the substrate and an outer second face. A channel extends through the cap from the second face to the first face and is in fluid communication with the transduction microstructure. The channel includes an internal sidewall. A protective membrane of porous polycrystalline silicon is across the channel and on the internal sidewall of the channel.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
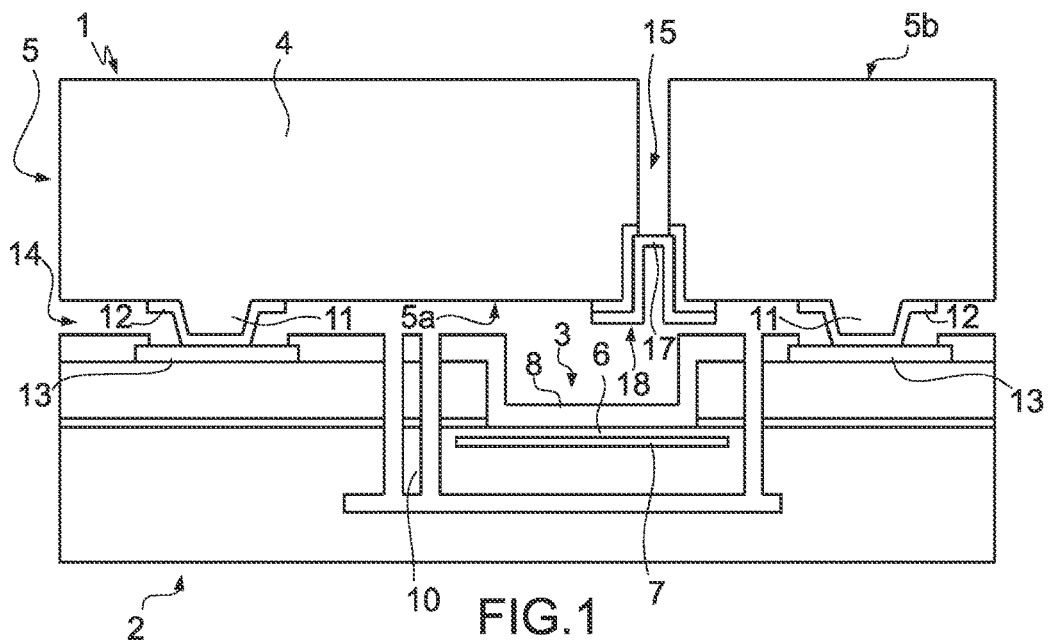
FIG. 1 is a cross-sectional view through a semiconductor device according to an embodiment of the present disclosure.

With reference to FIG. 1, a semiconductor device according to an embodiment of the present disclosure, in particular a transducer designated by the number 1, comprises a substrate 2, a transduction microstructure 3 integrated in the substrate 2, and a cap 5. In the example illustrated, the transducer 1 is a pressure sensor, and the transduction microstructure 3 comprises an elastic transduction membrane 6 that closes a chamber 7 at reference pressure on one side. In other embodiments not illustrated, the semiconductor device may be a different type of transducer, such as, by way of non-limiting example, an electro-acoustic transducer (a microphone or a speaker) or a sensor for detecting gases or volatile substances; an actuator; or a microfluidic device comprising a microfluidic circuit and possibly microfluidic components, such as micropumps and microfluidic valves. For instance, the semiconductor device may be a so-called "Lab-On-Chip", which requires at least one inlet for introducing a biological specimen to be analyzed or reagents into the microfluidic circuit from outside. Furthermore, it is understood that the transduction microstructure does not necessarily have to comprise mobile or deformable parts. For instance, in a sensor of volatile substances the transduction microstructure may comprise regions with fixed geometry obtained using materials with electrical properties that depend upon the concentration of the substances investigated.

The face of the transduction membrane 6 opposite to the chamber 7 may be free or be coated with a passivation layer 8 and communicates with the external environment, as clarified in detail in what follows. The thickness and rigidity of the passivation layer 8 are in any case selected so as to enable deformation of the transduction membrane 6 as a result of pressure variations within a detection range.

In an embodiment, the transduction microstructure 3 is connected to the remaining part of the substrate 2 by elastic suspension elements 10.

The cap 5 comprises a body 4 of semiconductor material, for example monocrystalline bulk silicon, and has a first face 5a adjacent to the substrate 2, to which it is joined, and a second face 5b facing outwards. The cap 5 has a thickness such as to offer mechanical protection to the transduction microstructure 3 and has a thickness in a first direction, for example, comprised between 100 μm and 700 μm.

Pedestals or extensions 11 extend from the first face 5a of the cap 5, are coated with respective coupling coatings 12, for example made of germanium, and are joined to respective bonding pads 13 of the substrate 2. The pedestals 11 have a height with respect to the first face 5a of the cap 5 such as to create a gap 14 between the cap 5, in particular the first face 5a, and the substrate 2. For instance, the height of the pedestals 11 in the first direction may be comprised between 1 μm and 10 μm. The transduction microstructure 3 communicates with the gap 14.

In the embodiment of FIG. 1, a channel 15 extends through the cap 5 from the second face 5b to the first face 5a. The channel 15 therefore has a first end open outwards and a second end open onto the gap 14 and communicating with the transduction microstructure 3. The channel 15 has a diameter in a second direction that is transverse to the first direction, selected according to design preferences and for example comprised between 10 μm and 30 μm.

Figure 2:
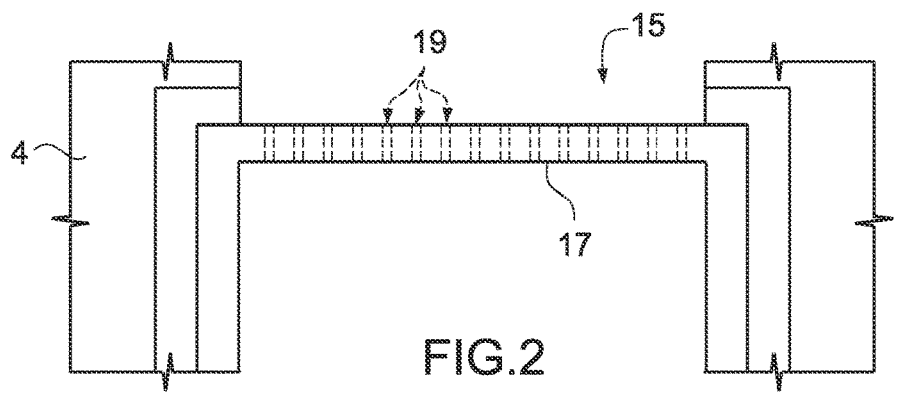
FIG. 2 shows an enlarged detail of the device of FIG. 1.

As illustrated in greater detail in FIG. 2, the cap 5 comprises a protective membrane 17 made of porous polycrystalline silicon and permeable to the aeriform substances, arranged across the channel 15. It is understood that the protective membrane 17 may be located on the second face 5b of the cap 5 at the first end of the channel 15, or on the first face 5a of the cap 5 at the second end of the channel 15, or in an intermediate position along the channel 15 between the first end and the second end, as in the example of FIG. 1. In particular, the protective membrane 17 is part of a region 18 of porous polycrystalline silicon, which extends from the first face 5a of the cap 5 towards the inside of the channel 15 and coats the side surface of the channel 15 itself between the first face 5a and the protective membrane 17. In one embodiment, the protective membrane 17 is released on both sides.

The porosity of the protective membrane 17 is selected so as to withhold granular solid materials, dust and particulate and enable passage of aeriform substances. In one embodiment, the pores 19 (FIG. 2) of the polycrystalline silicon forming the protective membrane 17 may have an equivalent diameter comprised between 5 nm and 50 nm. By "equivalent diameter" here we mean the diameter of a duct having a circular or round section of passage and an area equal to the area of the mean section of passage of the pore. The pores 19, which in FIG. 2 for simplicity are represented as rectilinear passages with constant section, extend in fact along generally curvilinear paths with variable cross-section. Moreover, the dimensions and density of the pores 19 of the protective membrane 17 are such that the empty/full ratio is comprised between 5% and 30%, for example 10%. With these characteristics, the protective membrane 17 is able to withhold even drops of water. As a result of the surface tension, in fact, the drops of water are unable to penetrate into the pores 19 in the absence of a pressure difference applied between the two sides of the protective membrane 17. The channel 15 is offset with respect to a center of the membrane 6.

Figure 3:
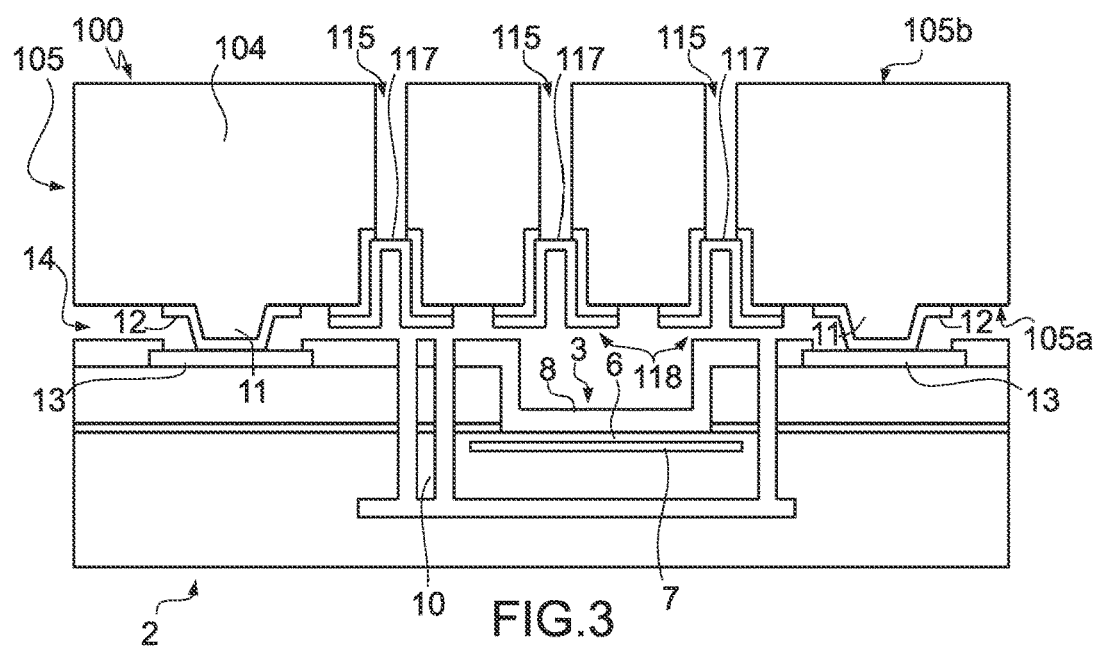
FIG. 3 is a cross-sectional view through a semiconductor device according to a different embodiment of the present disclosure.

With reference to FIG. 3, in one embodiment the packaged semiconductor transducer here designated by 100, comprises a plurality of channels 115, which extend through the cap 105 from a second face 105b to a first face 105a. Each channel 115 is provided with a respective protective membrane 117 made of polycrystalline silicon. The protective membranes 117 are portions of regions 118 of porous polycrystalline silicon and permeable to the aeriform substances, which extend from the second face 105b of the cap 105 towards the inside of the respective channels 115 and coat the side surface of the channels 115 themselves between the second face 105b and the protective membranes 117. The number, dimensions and position of the channels 115 are determined on the basis of the design preferences.

The plurality of channels 115 are positioned between ones of the pedestals 11. The channels 115 may be spaced by equal distances from adjacent channels. A first one of the channels, closer to a first one of the pedestals 11 is aligned to a first side of the membrane 6. A second one of the channels is positioned overlapping the membrane 6. A third one of the channels is on a second side of the membrane. The second channel is between the first and third channel. In the embodiment illustrated in FIG. 4, in a packaged semiconductor transducer 200 the protective membrane 217 forms part of a region 218 of porous polycrystalline silicon, which extends from a second outer face 205b of a cap 205 towards the inside of a channel 215 and coats a side surface of the channel 215 itself between the second face 205b and the protective membrane 217. The membrane 217 includes a portion on the second face 205b and a portion on the side surface or internal sidewall of the channel 215. The portion on the side surface extends partially into the channel such that more of the sidewall not covered by the portion of the membrane on the side surface 217.

The membrane 217 is on the second face 205b and the pedestals are on the first face 205a, opposite from each other.

The packaged semiconductor transducer 1 of FIG. 1 may be manufactured following the method described in what follows with reference to FIGS. 5-13.

The transduction microstructure 3 is obtained using a microstructure semiconductor wafer 2' (visible in FIG. 14) according to a known method.

Figure 5:
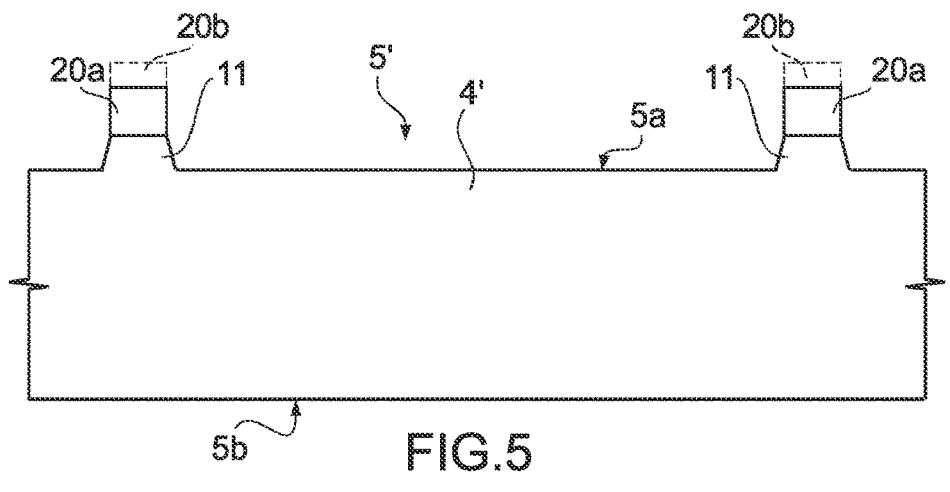
FIGS. 5-14 show a semiconductor wafer in successive machining steps of a process for manufacturing a semiconductor device according to one embodiment of the present disclosure.

To manufacture the cap 5 of FIG. 1, a cap semiconductor wafer 5', which comprises a bulk layer 4' of monocrystalline silicon, is etched through a first resist structure 20a, defined with a first mask 20b, as illustrated in FIG. 5. The bulk layer 4' is removed for a thickness corresponding to the height of the pedestals 11, which are formed in regions protected by the first mask 20. The height being from the surface 5a to an outermost surface of the pedestal.

Figure 6:
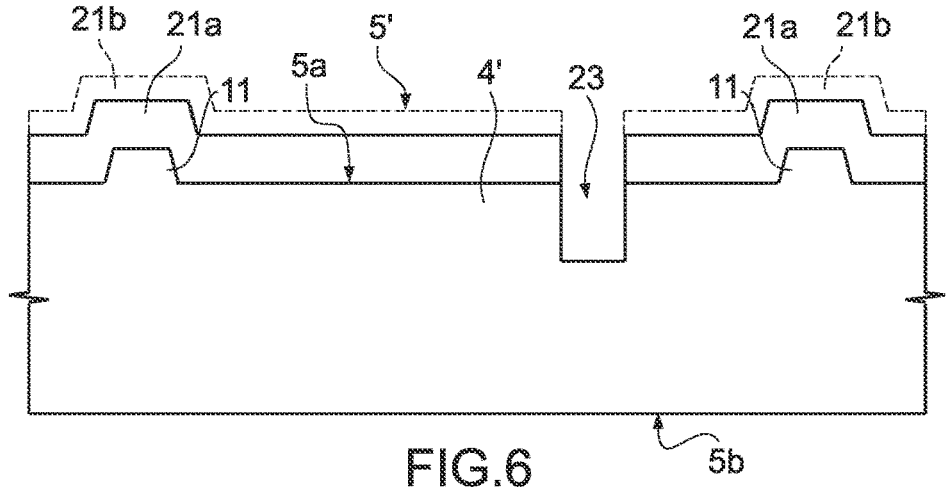
Figure 7:
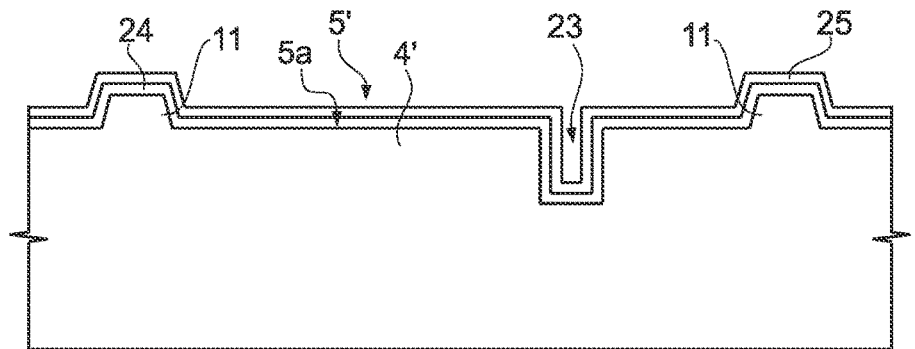

The cap semiconductor wafer 5' is then again dry-etched with a second resist structure 21a (defined with a second mask 21b) to open a trench 23, as shown in FIG. 6. In the example here illustrated, an anisotropic dry etch is used, but equally a wet etch could be used, according to the design preferences.

Then (FIG. 7), a stop layer 24 and a protection layer 25 of porous polycrystalline silicon and permeable to aeriform substances, are formed in succession on the cap semiconductor wafer 5', both on the first face 5a and inside the trench 23. The stop layer 24 may be a layer of silicon oxide deposited or grown thermally. Alternatively, a different material may be used that may be etched in a selective way with respect to the polycrystalline silicon, such as a multilayer of silicon oxide and silicon nitride. The protection layer 25 is deposited on the stop layer 24 and may have a thickness comprised between 80 nm and 150 nm. In addition, the diameter of the pores and the empty/full ratio of the protective silicon layer 25 are selected on the basis of the design preferences for the protective membrane 17 described above. For instance, the protection layer 25 has pores of equivalent diameter comprised between 5 nm and 50 nm, the size and the density of the pores being such that the empty/full ratio is comprised between 5% and 30%.

The stop layer 24 and the protection layer 25 coat in a conformable way the first face 5a of the cap semiconductor wafer 5', the side walls and the bottom of the trench 23. The portion of the protection layer 25 on the bottom of the trench 23 is to form the protective membrane 17.

Figure 8:
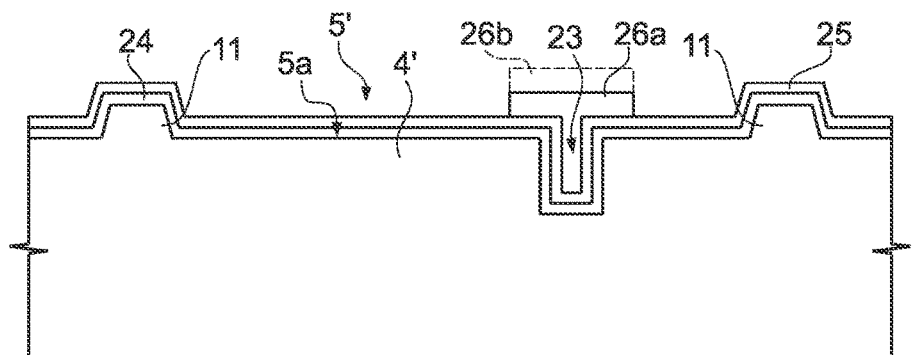
Figure 9:
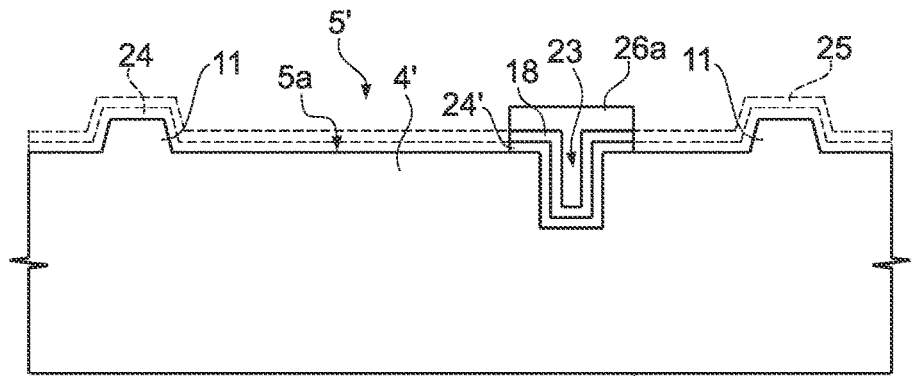

After the stop layer 24 and the protection layer 25 have been formed, a resist structure 26a is deposited and defined via a third mask 26b so as to protect the inside of the trench 23, as illustrated in FIG. 8. The stop layer 24 and the protection layer 25 are selectively etched where they are not protected by the third resist structure 26a (FIG. 9). The region 18 of porous polycrystalline silicon is thus obtained, which is separated from the layer of monocrystalline bulk silicon of the cap semiconductor wafer 5' by a stop structure 24', defined by a residual portion of the stop layer 24.

Figure 10:
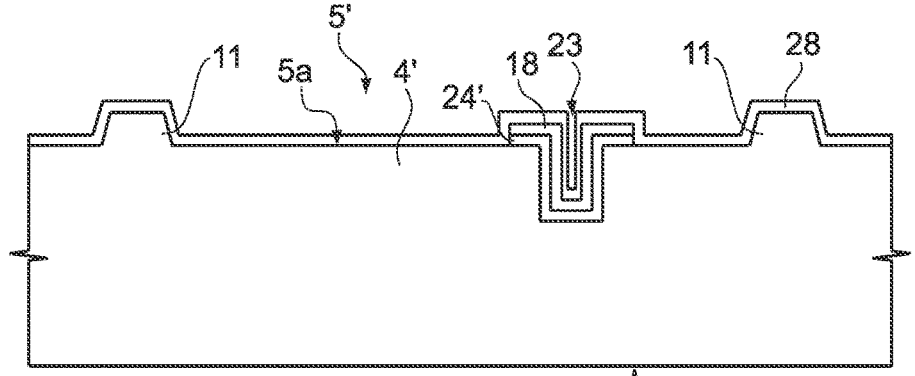

After the third resist structure 26a has been removed, a coupling layer 28, for example, of germanium, is deposited in a conformable way on the cap semiconductor wafer 5' (FIG. 10).

Figure 11:
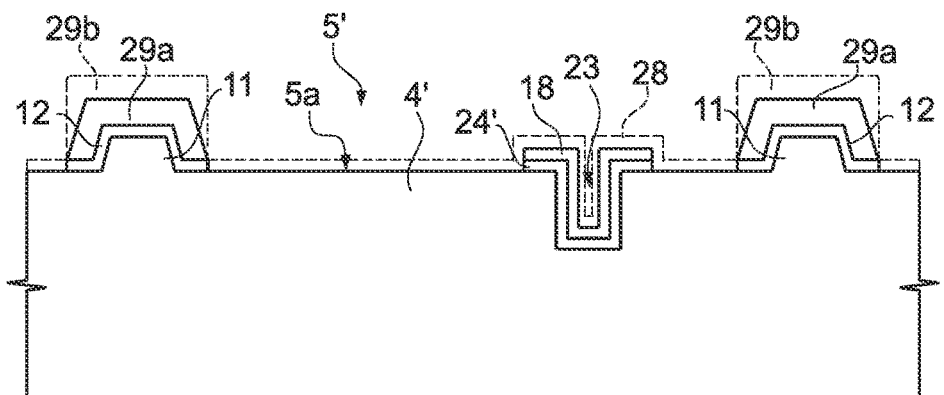
Figure 12:
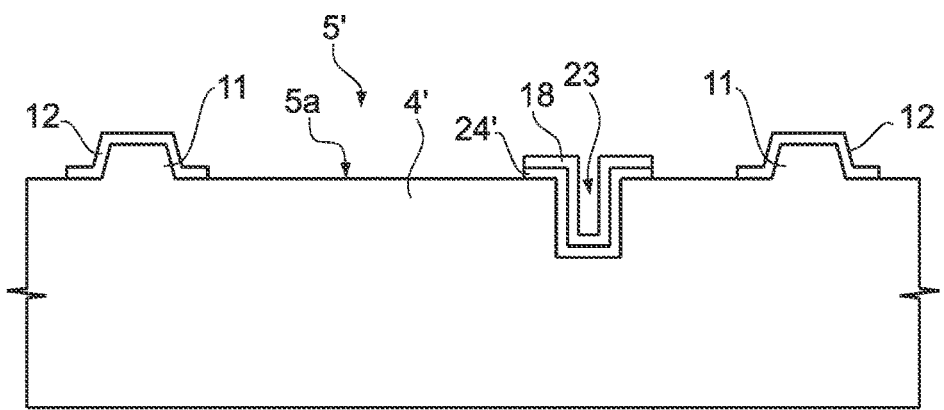

A fourth resist structure 29a is then deposited and defined via a fourth mask 29b (FIG. 11). The fourth resist structure 29a coats the pedestals 11 and the coupling layer 28 around them. The coupling layer 28 is selectively etched and removed where it is not protected by the fourth resist structure 29a. The coupling coatings 12 are thus created, as illustrated in FIG. 12.

Figure 13:
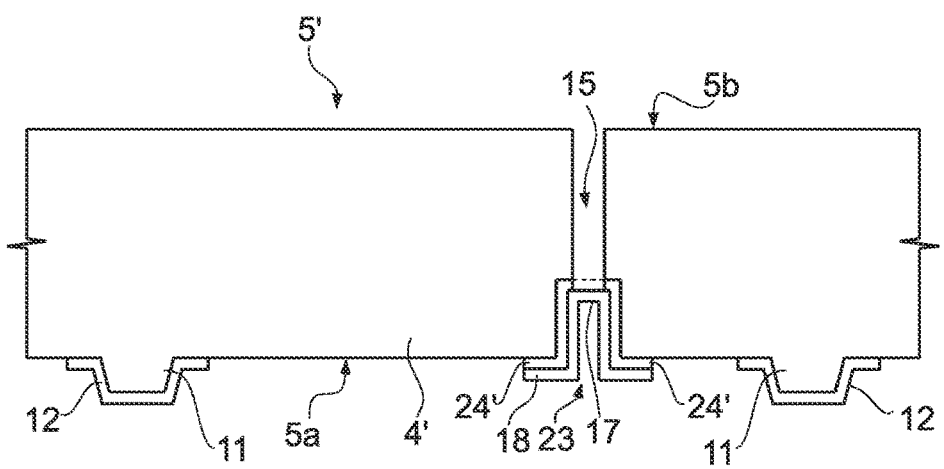

With reference to FIG. 13, the cap semiconductor wafer 5' is turned upside down and etched on the back with a markedly anisotropic etch, for example a trench etch, in a position corresponding (i.e., aligned) to the trench 23, until the stop structure 24' is reached, which in this step protects the region 18 of porous polycrystalline silicon. The channel 15 is thus completed. The stop structure 24' is then selectively etched. In particular, the portion of the stop structure 24' exposed within the channel 15 is removed, thus releasing the protective membrane 17. Consequently, the protective membrane 17 extends in a direction transverse to a longitudinal axis of the channel 15 (i.e., an axis directed from the first end to the second end of the channel 15). The portions of the channel 15 on opposite sides of the protective membrane 17 communicate with one another through the protective membrane 17 of porous polycrystalline silicon.

The cap semiconductor wafer 5' is finally joined to the bonding pads 13 of the microstructure semiconductor wafer 2' to form a composite wafer (FIG. 14), which is diced, thus obtaining a plurality of examples of the packaged semiconductor transducer 1 of FIG. 1. Each example comprises a portion of the microstructure semiconductor wafer 2', which defines the substrate 2 and contains the transduction microstructure 3, and a portion of the cap semiconductor wafer 5', which defines the cap 5.

In order to manufacture the packaged semiconductor transducer 100 of FIG. 3, the method described may be immediately adapted by modifying the masks 21 and 26 and the trench etch on the back of the cap semiconductor wafer so as to open the desired number of channels instead of just one.

Figure 4:
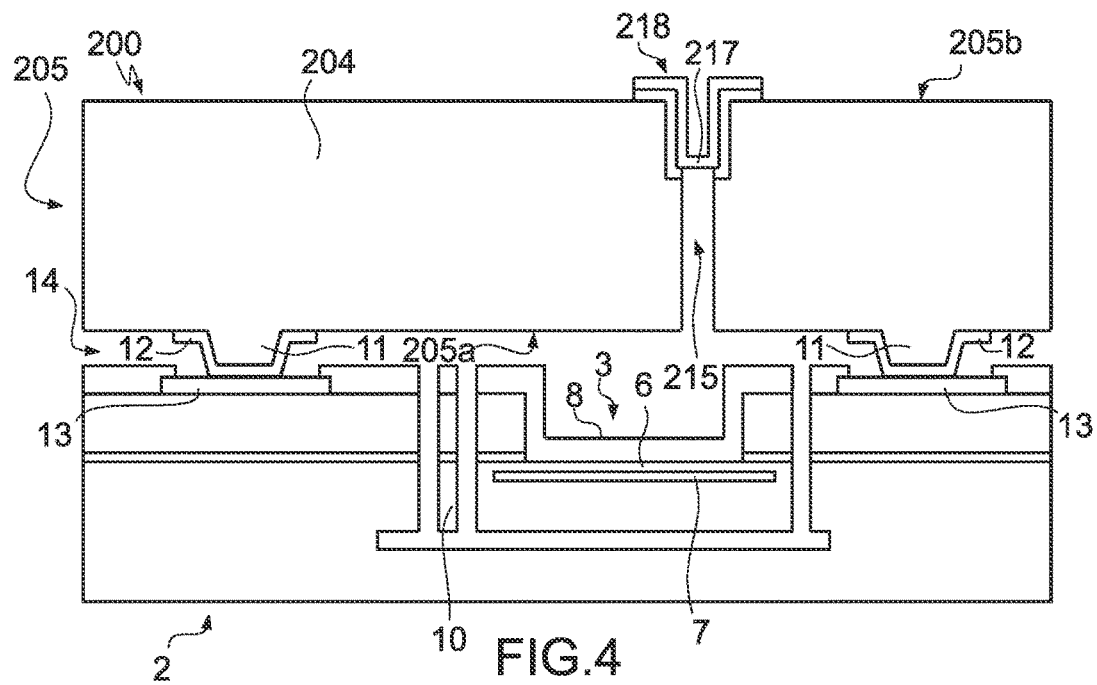
FIG. 4 is a cross-sectional view through a semiconductor device according to a further embodiment of the present disclosure.

In order to manufacture the packaged semiconductor transducer 200 of FIG. 4, instead, the cap semiconductor wafer is turned upside down after the pedestals 11 have been formed. The machining operation proceeds on the back of the cap semiconductor wafer (second face 205b), as already described until the stop layer 24 and the protective silicon layer 25 are etched to form the region 218 of porous polycrystalline silicon and the stop structure 24'. Before depositing the germanium coupling layer, the wafer is again turned over. Machining proceeds with formation and definition of the coupling layer on the first face 205a of the cap semiconductor wafer and with anisotropic etching of the bulk layer to form the channel 215, followed by selective removal of the stop layer within the channel 215. The cap semiconductor wafer is joined to the microstructure semiconductor wafer 2' and, after singulation of the composite wafer thus obtained, examples of the packaged semiconductor transducer 200 of FIG. 4 are obtained.

Figures 14, 15:
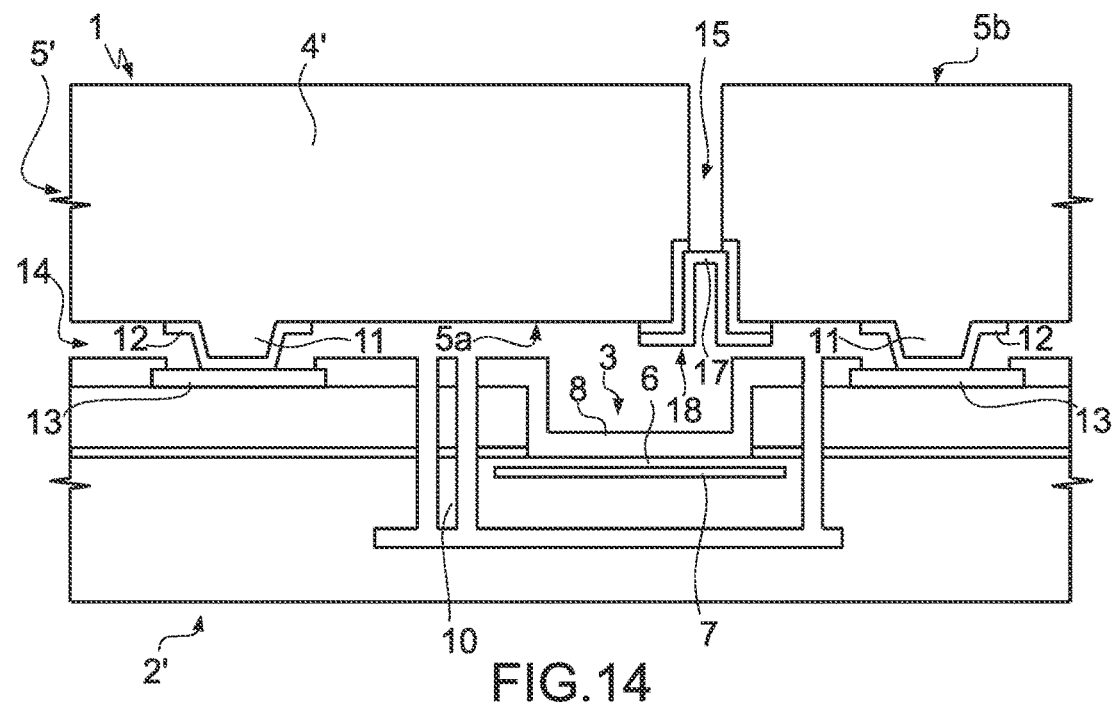
FIG. 15 is a cross-sectional view through a semiconductor device according to another embodiment of the present disclosure.

With reference to FIG. 15, a packaged semiconductor transducer 300 according to an embodiment of the present disclosure is designated by number 300 and comprises the substrate 2, the transduction microstructure 3 integrated in the substrate 2 and a cap 305.

The cap 305 comprises a bulk layer 304, a stop layer 324, a structural layer 341 and a protection layer 325 of porous polycrystalline silicon and permeable to aeriform substances. The stop layer 324, of silicon oxide, is interposed between the bulk layer 304, of monocrystalline silicon, and the structural layer 341, of a material that can be selectively etchable with respect to the structural layer 341, for example silicon nitride.

Channels 315 extend from a second face 305b to a first face 305a of the cap 305 through the bulk layer 304, the stop layer 324, and the structural layer 341. The protection layer 325 forms protective membranes 317 in the channels 315. More precisely, the protection layer 325, which covers the first face 305a of the cap 305, penetrates into the channels 315 coating the side surfaces substantially as far as an interface 343 between the structural layer 341 and the stop layer 324. At the depth of the interface 343, the protection layer 325 extends in a direction transverse to longitudinal axes of the channels 315 to form the protective membranes 317.

The first face 305a of the cap 305 is joined to the substrate 2 by pedestals 311 that act as adhesion structures and, at the same time, have a height such as to create a gap 314 between the substrate 2 and the cap 305.

The microstructure 3 communicates with the outside through the channels 315 and the protective membranes 317, which enable passage of aeriform substances.

Figure 16:
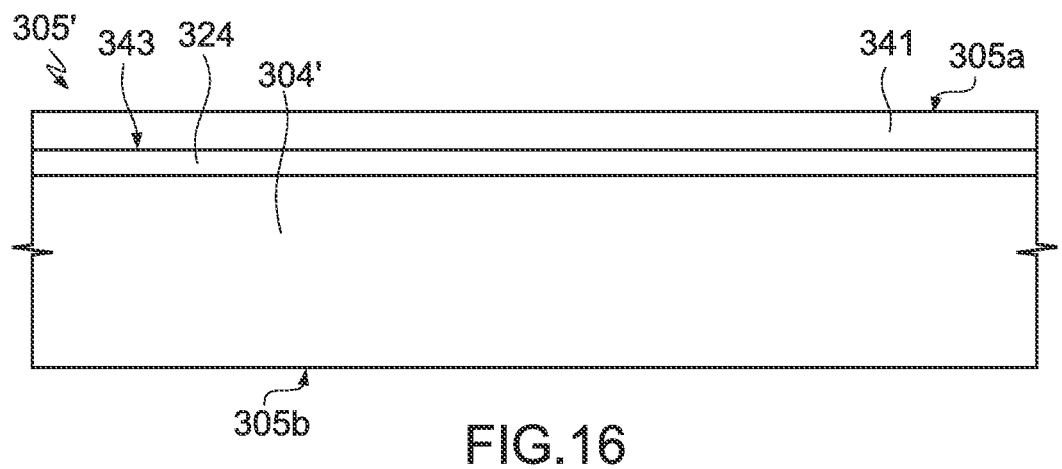
FIGS. 16-19 show a semiconductor wafer in successive machining steps of a process for manufacturing a semiconductor device according to a different embodiment of the present disclosure.

Whereas the transduction microstructure 3 is obtained using a microstructure semiconductor wafer 2' as already described, according to a method for manufacturing the packaged semiconductor transducer 300 of FIG. 15 illustrated in FIGS. 16-19, a cap semiconductor wafer 305' initially comprises the bulk layer 304. The stop layer 324 and the structural layer 341 are formed in succession on the bulk layer 304 (FIG. 16).

Figure 17:
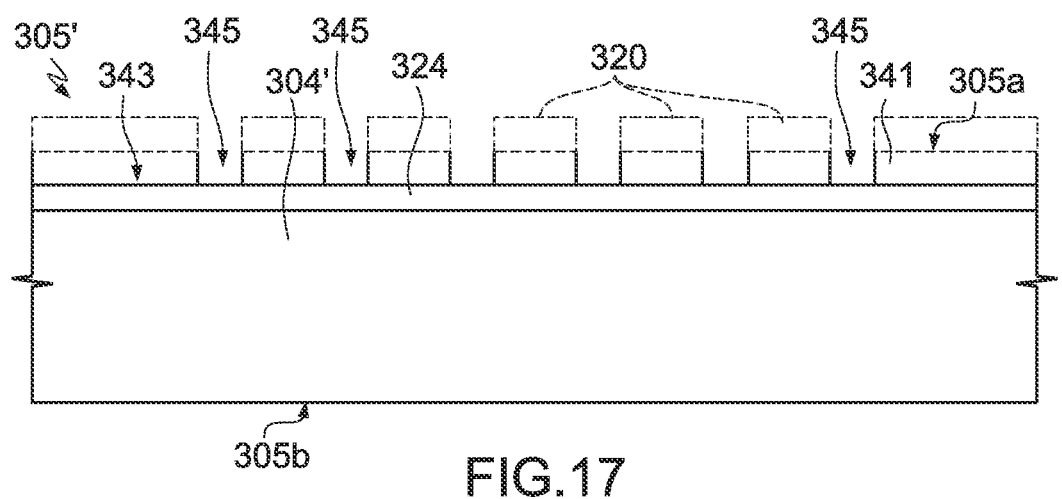
Figure 18:
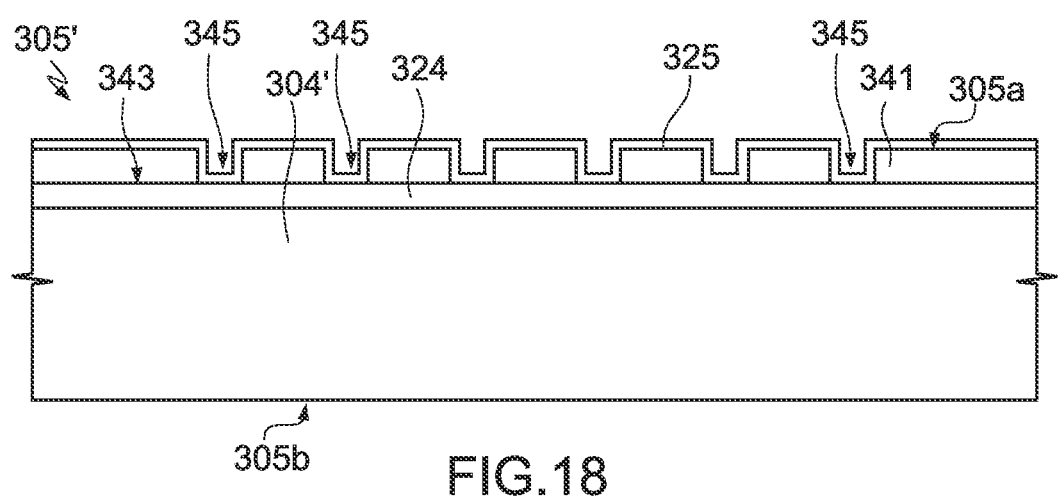

The structural layer 341 is then selectively etched using a mask 320 for opening cavities 345, which extend as far as the stop layer 324, as illustrated in FIG. 17.

Figure 19:
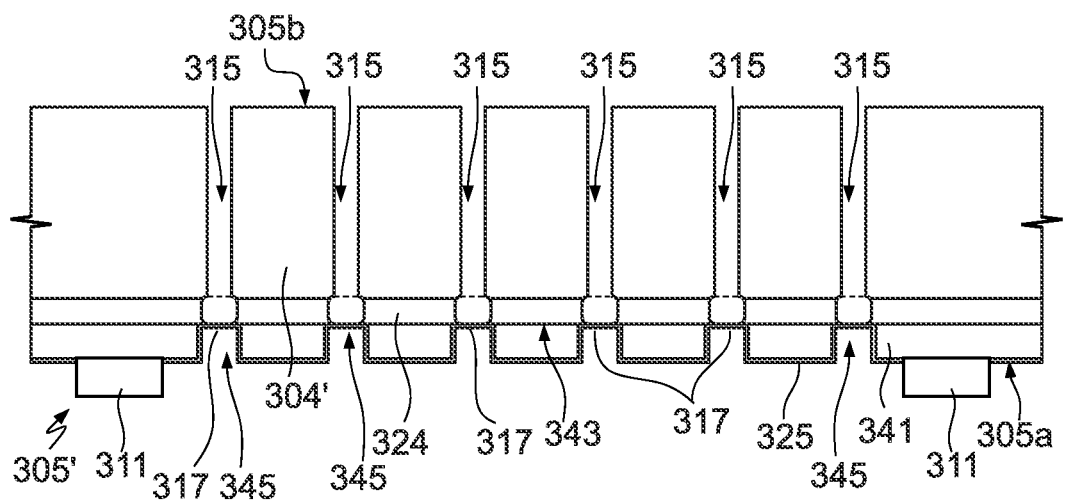

The protection layer 325 is then formed on the first face 305a of the cap semiconductor wafer 305' (FIG. 18), which is then turned upside down and etched on the back, i.e., on the side of the second face 305b, in positions corresponding (aligned) to respective cavities 345 (FIG. 19). In particular, a markedly anisotropic trench etch is first carried out as far as the stop layer 324, and then the stop layer 324 is etched where it is left exposed. In this way, the protective membranes 317 are freed and the channels 315 are completed.

The protection layer 325 is selectively etched to expose the structural layer 341 where the pedestals 311 are then formed.

The cap semiconductor wafer 305' is finally joined to the bonding pads 13 of the microstructure semiconductor wafer 2' to form a composite wafer, which is then diced, thus obtaining a plurality of examples of the packaged semiconductor transducer 300 of FIG. 15. Each example comprises a portion of the microstructure semiconductor wafer 2', which defines the substrate 2 and contains the transduction microstructure 3, and a portion of the cap semiconductor wafer 305', which defines the cap 305.

The disclosure described presents various advantages. From the structural standpoint, the presence of the protective membrane through the channel or channels prevents any contamination of the transduction microstructure with particulate and dust within the device, without jeopardizing the fluidic connection with the outside world, in particular for aeriform substances. Furthermore, the protective membrane prevents or at least hinders entry of small amounts of liquid, for example due to exposure to splashes or to the use during sports activity. In the case of water, for example, the diameter of the pores of the protective membrane is sufficient to prevent entry of drops as a result of the surface tension.

Proper operation of the transducer is ensured because the transduction microstructure, albeit remaining protected from contaminating agents, is in any case adequately exposed and coupled to the quantities to be detected (pressure, substances, etc.) thanks to the porosity of the protective membrane. Indeed, the constraints on the minimum diameter of the channel may even be at least in part relaxed because the barrier effect against contaminating agents is performed effectively by the protective membrane. Therefore, the presence of the protective membrane also affords a greater flexibility in design of the cap.

As regards the manufacturing method, the use of the stop layer between the layer of porous polycrystalline silicon and the bulk layer enables definition and release of the protective membrane within the channels in a simple way during machining at the wafer level. Operations for applying polymeric membranes at the device level following upon singulation can thus be avoided, with considerable reduction in costs. Moreover, the stop layer and the layer of porous polycrystalline silicon may be formed with standard techniques of machining of semiconductors and therefore in a reliable and inexpensive way. Also the characteristics of the protective membrane, such as porosity and thickness, may be easily controlled.

Etching of the bulk layer on both sides, before opening the trench on one side and then with anisotropic etching on the opposite side, makes it possible to obtain extreme shape ratios through the channel that traverses the cap. Furthermore, the channels can be formed without any need to thin the bulk layer of the cap wafer and therefore without degrading the mechanical resistance thereof. This adds flexibility to the design and to manufacturing of semiconductor transducers.

Figure 20:
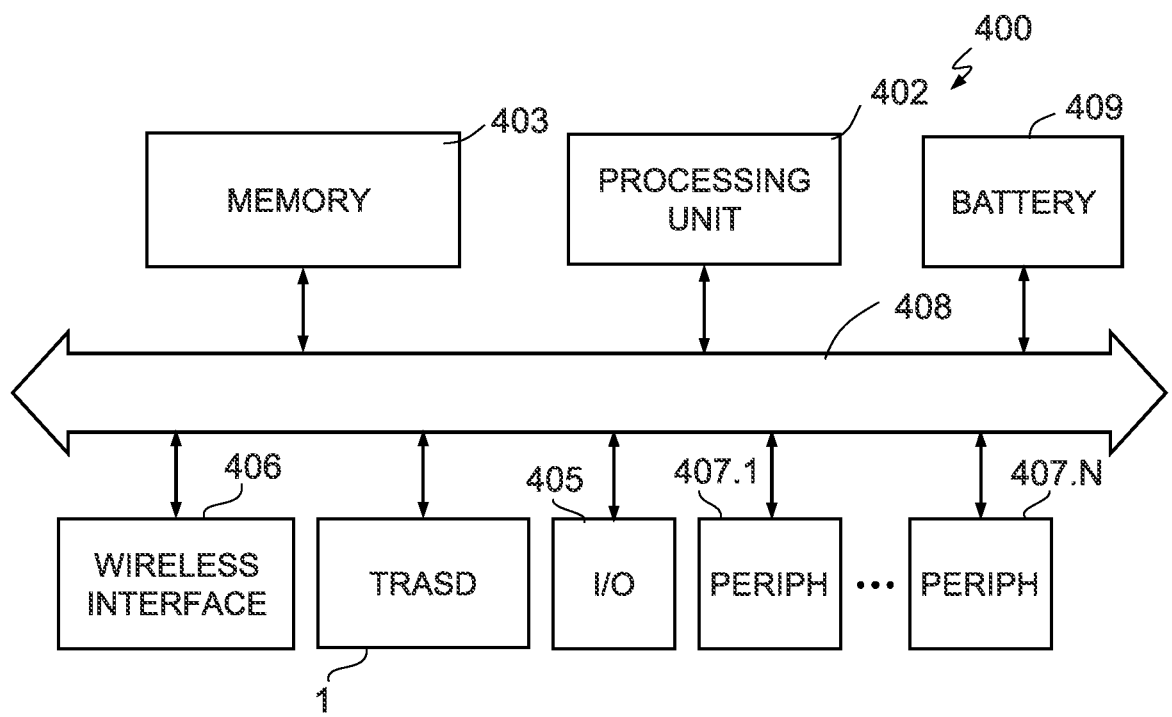
FIG. 20 is a simplified block diagram of an electronic system incorporating a semiconductor device according to the present disclosure.

FIG. 20 shows an electronic system 400 that may be of any type, in particular, but not exclusively, a wearable device, such as a watch, a bracelet, or a smart band; a computer, such as a mainframe, a personal computer, a laptop or a tablet; a smartphone; a digital music player, a digital camera or any other device designed to process, store, transmit or receive information. The electronic device 1 may be a general-purpose or embedded processing system in a device, an apparatus or a further system.

The electronic system 400 comprises a processing unit 402, memory devices 403, a packaged semiconductor transducer, for example the packaged semiconductor transducer 1 of FIG. 1, and may moreover be provided with input/output (I/O) devices 405 (for example a keyboard, a mouse or a touchscreen), a wireless interface 406, peripherals 407.1, . . . , 407.N and possibly further auxiliary devices (here not illustrated). The components of the electronic system 400 may be coupled in communication with one another directly and/or indirectly through a bus 408. The electronic system 400 may moreover comprise a battery 409. It should be noted that the scope of the present disclosure is not limited to embodiments necessarily having one or all of the devices listed.

The processing unit 402 may for example comprise one or more microprocessors, microcontrollers, and the like, according to the design preferences.

The memory devices 403 may comprise volatile memory devices and non-volatile memory devices of various kinds, for example SRAMs and/or DRAMs for volatile and solid-state memories, magnetic disks and/or optical disks for non-volatile memories.

Finally, it is evident that modifications and variations may be made to the device and to the method described, without thereby departing from the scope of the present disclosure.

A semiconductor device may be summarized as including a substrate (2); a transduction microstructure (3) integrated in the substrate (2); a cap (5; 105; 205; 305) joined to the substrate (2) and having a first face (5a; 105a; 205a; 305a) adjacent to the substrate (2) and an outer second face (5b; 105b; 205b; 305b); a channel (15; 115; 315) extending through the cap (5; 105; 205; 305) from the second face (5b; 105b; 205b; 305b) to the first face (5a; 105a; 205a; 305a) and communicating with the transduction microstructure (3); a protective membrane (17; 117; 217; 317) made of porous polycrystalline silicon and permeable to aeriform substances, the protective membrane (17; 117; 217; 317) being arranged across the channel (15; 115; 315).

The protective membrane (17; 117; 217; 317) may be located along the channel (15; 115; 315) at an intermediate position between the second face (5b; 105b; 205b; 305b) and the first face (5a; 105a; 205a; 305a).

The protective membrane (17; 117; 217; 317) may have pores (19) with an equivalent diameter comprised between 5 nm and 50 nm.

A gap (14) may be defined between the first face (5a; 105a; 205a; 305a) of the cap (5; 105; 205; 305) and the substrate (2) and wherein the transduction microstructure (3) and the channel (15; 115; 315) communicate with the gap (14).

The device may include a region (18; 118; 218) of porous polycrystalline silicon that coats a side surface of the channel (15; 115; 215) between the protective membrane (17; 117; 218) and one between the first face (5a; 105a) and the second face (205a), wherein the protective membrane (17) may be part of the region (18; 118; 218) of porous polycrystalline silicon.

The device may include a plurality of channels (115; 315) and a plurality of protective membranes (117; 317) of porous polycrystalline silicon and permeable to aeriform substances, each protective membrane (17; 117; 217; 317) being arranged across a respective one of the channels (115; 315).

An electronic system may be summarized as including a processing unit (402) and a semiconductor device (1; 100; 200; 300).

A method for manufacturing a semiconductor device, may be summarized as including forming a transduction microstructure (3) in a microstructure semiconductor wafer (2'); forming a stop layer (24; 324) on a bulk layer (4'; 304') of a cap semiconductor wafer (5'; 305'); forming a protection layer (25; 325) made of porous polycrystalline silicon and permeable to aeriform substances at least in part on the stop layer (24; 324); forming a channel (15; 115; 315) through the cap semiconductor wafer (5'; 305') from a first face (5a; 105a; 205a; 305a) to a second face (5b; 105b; 205b; 305b) thereof, wherein forming the channel (15; 115; 315) comprises etching in an anisotropic way the bulk layer (4'; 304') as far as the stop layer (24; 324) on one side of the cap semiconductor wafer (5'; 305') opposite to the protection layer (25; 325); removing the stop layer (24; 324) inside the channel (15; 315); and joining the cap (5; 105; 205; 305) to the microstructure semiconductor wafer (2') so that the channel (15; 115; 315) will communicate with the transduction microstructure (3).

Forming the channel (15; 315) may include forming a depression (23; 345) in the cap semiconductor wafer (5'; 305') and wherein forming the protection layer (25; 325) may include depositing the protection layer (25; 325) within the depression (23; 345).

Forming the depression (23) may include opening a trench in the bulk layer (4').

Forming the depression (345) may include depositing a structural layer (341) on the stop layer (324) and selectively etching the structural layer (341).

Forming the protection layer (25; 325) may include depositing the protection layer (25; 325) directly in contact with the stop layer in the depression (23; 345).

The protection layer (25; 325) may have pores (19) with an equivalent diameter comprised between 5 nm and 50 nm and wherein the dimensions and density of the pores (19) may be such that an empty/full ratio of the protection layer (25; 325) is comprised between 5% and 30%.

Forming the channel (15; 115; 315) may include etching in an anisotropic way the bulk layer (4'; 304') in a position corresponding to the depression (23; 45).

The method may include forming a plurality of channels (115; 315) through the cap semiconductor wafer (5'; 305') from the first face (5a; 105a; 205a; 305a) to the second face (5b; 105b; 205b; 305b) thereof.

The method may include forming pedestals (11) extending from the first face (5a; 105a; 205a; 305a) of the cap semiconductor wafer (5'; 305'); and forming coupling coatings (12) on the pedestals (11); wherein joining the cap semiconductor wafer (5'; 305') to the microstructure semiconductor wafer (2') may include joining the pedestals (11) to the microstructure semiconductor wafer (2'); wherein the pedestals (11) may have a height with respect to the first face (5a; 105a; 205a; 305a) of the cap semiconductor wafer (5'; 305') such as to create a gap (14) between the first face (5a; 105a; 205a; 305a) and the microstructure semiconductor wafer (2') of the substrate (2); and wherein the transduction microstructure (3) and the channel (15; 115; 315) communicate with the gap (14).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
   a substrate;
   a transduction microstructure in the substrate;
   a cap coupled to the substrate and having a first face facing the substrate and an outer second face;
   a channel extending through the cap from the second face to the first face and in fluid communication with the transduction microstructure, the channel including an internal sidewall;
   a protective membrane of porous polycrystalline silicon, the protective membrane having pores with an equivalent diameter comprised between 5 nm and 50 nm and being across the channel and on the internal sidewall of the channel.

2. The device according to claim 1 wherein the protective membrane across the channel is at an intermediate position between the second face and the first face.

3. The device according to claim 1 wherein a gap is between the first face of the cap and the substrate and the transduction microstructure and the channel are in fluid communication with the gap.

4. The device according to claim 1 wherein the protective membrane includes a portion on the first face and a portion on the internal sidewall of the channel.

5. The device according to claim 1, further comprising a plurality of additional channels and a plurality of additional protective membranes of porous polycrystalline silicon, each additional protective membrane being across a respective one of the plurality of additional channels.

6. A device, comprising:
   a substrate;
   a chamber in the substrate;
   a membrane aligned with the chamber, wherein the membrane has pores with an equivalent diameter comprised between 5 nm and 50 nm;
   a cap that includes:
      a first surface facing the membrane;
      a second surface that is opposite the first surface;
      an opening from the first surface to the second surface;
      a porous silicon layer that covers the opening.

7. The device of claim 6 wherein the porous silicon layer includes a first portion on the first surface of the cap and a second portion on an interior wall of the opening.

8. The device of claim 6 wherein the porous silicon layer includes a first portion on the second surface of the cap and a second portion on an interior wall of the opening.

9. The device of claim 6 wherein the cap includes a first extension from the first surface and a second extension from the first surface, the opening being between the first extension and the second extension, the porous silicon layer having an end on the first surface that is spaced from an interior wall of the opening toward the first and second extensions.

10. The device of claim 9 wherein the end is spaced from the first extension by a first distance and from the second extension by a second distance that is less than the first distance.

11. A device, comprising:
a substrate;
a transduction microstructure in the substrate; and
a cap coupled to the substrate and having a first face and a second face opposite the first face, wherein the cap includes:
   a first layer facing the second face of the cap;
   a second layer on the first layer;
   a third layer opposite to the first layer and adjacent to the second layer;
   a porous layer covering the third layer; and
   a plurality of channels extending from the second face to the first face through the first, second, and third layers;
   a plurality of membranes in the porous layer across the plurality of channels.

12. The device of claim 11, wherein each channel includes an internal sidewall.

13. The device of claim 11, wherein the second layer is between the first layer and the third layer.

14. The device of claim 11, further comprising an interface between the third layer and the second layer.

15. The device of claim 14, wherein the porous layer coats the internal sidewalls of the plurality of channels as far as the interface between the third layer and second layer.

16. The device of claim 11, further comprising pedestals that couple the first face of the cap to the substrate.

17. The device of claim 16, comprising a gap between the first face of the cap and the substrate.

18. The device of claim 17, wherein the gap extends from a first side of the transduction microstructure to a second side of the transduction microstructure, the gap extending transverse to the first and second faces of the cap.

19. The device of claim 17, wherein the gap is in fluid communication with the transduction microstructure and the plurality of channels.

* * * * *